US011024367B2

(12) United States Patent
Hiscock et al.

(10) Patent No.: US 11,024,367 B2
(45) Date of Patent: *Jun. 1, 2021

(54) MEMORY WITH ON-DIE DATA TRANSFER

(71) Applicant: Micron Technology, Inc., Boise, ID (US)

(72) Inventors: Dale H. Hiscock, Boise, ID (US); Debra M. Bell, Boise, ID (US); Michael Kaminski, Boise, ID (US); Joshua E. Alzheimer, Boise, ID (US); Anthony D. Veches, Boise, ID (US); James S. Rehmeyer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/017,545

(22) Filed: Sep. 10, 2020

(65) Prior Publication Data
US 2020/0411081 A1     Dec. 31, 2020

Related U.S. Application Data

(63) Continuation of application No. 16/237,115, filed on Dec. 31, 2018, now Pat. No. 10,803,926.

(51) Int. Cl.
| | |
|---|---|
| *G11C 5/02* | (2006.01) |
| *G11C 11/4093* | (2006.01) |
| *G11C 11/406* | (2006.01) |
| *G11C 7/18* | (2006.01) |
| *H01L 25/10* | (2006.01) |
| *G11C 11/4096* | (2006.01) |

(52) U.S. Cl.
CPC .......... *G11C 11/4093* (2013.01); *G11C 5/025* (2013.01); *G11C 7/18* (2013.01); *G11C 11/406* (2013.01); *G11C 11/4096* (2013.01); *H01L 25/105* (2013.01)

(58) Field of Classification Search
CPC ....... G11C 11/4093; G11C 5/025; G11C 7/18; G11C 11/406; G11C 11/4096
See application file for complete search history.

(56) References Cited

U.S. PATENT DOCUMENTS 7,079,444 B2 *   7/2006   Lee ..................... G06F 11/1044
                                              365/189.05
7,969,807 B2     6/2011   Hokenmaier et al.
(Continued)

*Primary Examiner* — Pho M Luu
(74) *Attorney, Agent, or Firm* — Perkins Coie LLP

(57) ABSTRACT

Memory devices and systems with on-die data transfer capability, and associated methods, are disclosed herein. In one embodiment, a memory device includes an array of memory cells and a plurality of input/output lines operably connecting the array to data pads of the device. In some embodiments, the memory device can further include a global cache and/or a local cache. The memory device can be configured to internally transfer data stored at a first location in the array to a second location in the array without outputting the data from the memory device. To transfer the data, the memory device can copy data on one row of memory cells to another row of memory cells, directly write data to the second location from the first location using data read/write lines of the input/output lines, and/or read the data into and out of the global cache and/or the local cache.

20 Claims, 4 Drawing Sheets

(56) References Cited

U.S. PATENT DOCUMENTS

| | | | |
|---|---|---|---|
| 8,817,549 B2* | 8/2014 | Shin | G11C 5/025 |
| | | | 365/189.03 |
| 8,848,462 B2* | 9/2014 | Luo | G11C 7/1051 |
| | | | 365/189.05 |
| 9,076,548 B1 | 7/2015 | Park et al. | |
| 9,293,180 B2 | 3/2016 | Jeong et al. | |
| 9,767,050 B2 | 9/2017 | Doo et al. | |
| 9,767,882 B2 | 9/2017 | Shin et al. | |
| 10,141,042 B1 | 11/2018 | Richter | |
| 10,762,946 B2 | 9/2020 | Hiscock et al. | |
| 10,803,926 B2* | 10/2020 | Hiscock | G11C 11/4093 |
| | | | 365/51 |
| 2003/0028711 A1 | 2/2003 | Woo et al. | |
| 2009/0225616 A1 | 9/2009 | Hokenmaier et al. | |
| 2016/0071591 A1 | 3/2016 | Hsu | |
| 2020/0211626 A1 | 7/2020 | Hiscock et al. | |
| 2020/0211636 A1 | 7/2020 | Hiscock et al. | |
| 2020/0357461 A1 | 11/2020 | Hiscock et al. | |

\* cited by examiner

MEMORY WITH ON-DIE DATA TRANSFER

CROSS-REFERENCE TO RELATED APPLICATION(S)

This application is a continuation of U.S. application Ser. No. 16/237,115, filed Dec. 31, 2018, now U.S. Pat. No. 10,803,926; which is incorporated herein by reference in its entirety.

This application contains subject matter related to U.S. patent application Ser. No. 16/237,013 by Dale H. Hiscock et al., titled "MEMORY WITH PARTIAL ARRAY REFRESH," filed on Dec. 31, 2018, and assigned to Micron Technology, Inc. The subject matter of U.S. patent application Ser. No. 16/237,013 is incorporated herein by reference thereto.

TECHNICAL FIELD

The present disclosure is related to memory systems, devices, and associated methods. In particular, the present disclosure is related to memory devices with on-die data transfer capability, and associated systems and methods.

BACKGROUND

Memory devices are widely used to store information related to various electronic devices such as computers, wireless communication devices, cameras, digital displays, and the like. Memory devices are frequently provided as internal, semiconductor, integrated circuits and/or external removable devices in computers or other electronic devices. There are many different types of memory, including volatile and non-volatile memory. Volatile memory, including static random access memory (SRAM), dynamic random access memory (DRAM), and synchronous dynamic random access memory (SDRAM), among others, may require a source of applied power to maintain its data. Non-volatile memory, by contrast, can retain its stored data even when not externally powered. Non-volatile memory is available in a wide variety of technologies, including flash memory (e.g., NAND and NOR), phase change memory (PCM), ferroelectric random access memory (FeRAM), resistive random access memory (RRAM), and magnetic random access memory (MRAM), among others. Improving memory devices, generally, may include increasing memory cell density, increasing read/write speeds or otherwise reducing operational latency, increasing reliability, increasing data retention, reducing power consumption, or reducing manufacturing costs, among other metrics.

BRIEF DESCRIPTION OF THE DRAWINGS

Many aspects of the present disclosure can be better understood with reference to the following drawings. The components in the drawings are not necessarily to scale. Instead, emphasis is placed on illustrating clearly the principles of the present disclosure. The drawings should not be taken to limit the disclosure to the specific embodiments depicted, but are for explanation and understanding only.

DETAILED DESCRIPTION

Figure 1:
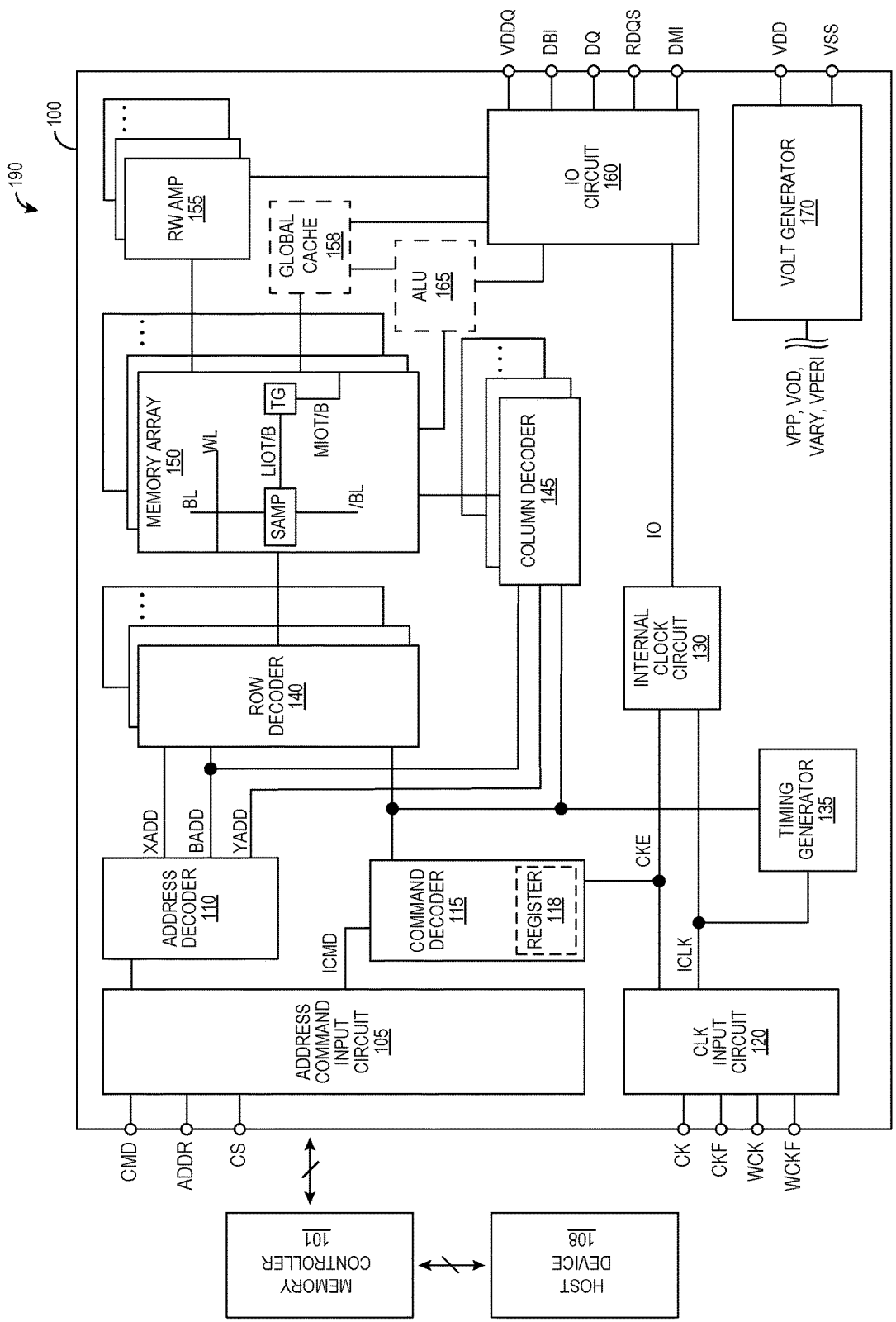
FIG. 1 is a block diagram schematically illustrating a memory system configured in accordance with various embodiments of the present technology.

As discussed in greater detail below, the technology disclosed herein relates to memory systems and devices (and associated methods) capable of internally transferring data within the memory devices from one memory location to another. A person skilled in the art, however, will understand that the technology may have additional embodiments and that the technology may be practiced without several of the details of the embodiments described below with reference to FIGS. 1-4. In the illustrated embodiments below, the memory devices and systems are primarily described in the context of devices incorporating DRAM storage media. Memory devices configured in accordance with other embodiments of the present technology, however, can include other types of memory devices and systems incorporating other types of storage media, including PCM, SRAM, FRAM, RRAM, MRAM, read only memory (ROM), erasable programmable ROM (EPROM), electrically erasable programmable ROM (EEROM), ferroelectric, magnetoresistive, and other storage media, including non-volatile, flash (e.g., NAND and/or NOR) storage media.

Conventional memory devices and systems (e.g., volatile memory devices and systems) are configured to store data to an array of memory cells. These conventional devices and systems often write data to memory cells at various locations across the memory array, meaning that the data is not consolidated on the conventional memory devices at the time it is written. Furthermore, portions of data stored on the memory cells can be intentionally erased, be accidentally lost (e.g., due to charge leakage and/or loss of power to the conventional devices and systems), and/or become stale (e.g., become junk data). Thus, even if data is initially consolidated on the conventional memory devices at the time it is written, portions of the data that remain stored on the memory cells can become fragmented across the memory array over time. To consolidate, reconsolidate, rearrange, and/or otherwise manipulate data already written to the memory cells, the conventional devices and systems must read the data out of the conventional memory devices and rewrite the read data to (e.g., physically or logically contiguous) memory cells at other memory locations of the conventional memory devices. This process is power intensive because data that is already written to memory cells must be read out from the memory cells and rewritten to other memory cells using input/output (TO) data lines of the conventional memory devices as well as using DQ data lines externally connected to the conventional memory devices. This process therefore also consumes IO bandwidth because the IO data lines and the DQ data lines are occupied until the consolidation, reconsolidation, rearrangement, and/or manipulation operations are completed.

To address these limitations, several embodiments of the present technology are directed to memory devices (e.g., volatile memory devices), systems including memory devices, and methods of operating memory devices in which data written to one memory location can be internally transferred to another memory location of the memory devices (e.g., without using the IO data lines of and/or the DQ data lines externally connected to the memory devices). In some embodiments, data saved on one row of memory cells of a memory device can be copied to another row of memory cells. In these and other embodiments, a memory device can include one or more local and/or global caches. In these embodiments, data stored at one memory location can be read into the one or more local and/or global caches and/or can be written to another memory location from the one or more local and/or global caches. In these and still other embodiments, data stored on memory cells at one memory location can be directly transferred to memory cells at another memory location by using data read/write (DRW) lines and/or the IO data lines of the memory device (i.e., without using the DQ data lines externally connected to the memory device to conduct the data transfer). In these and other embodiments, a memory device can be configured to track and/or report data transfers such that a memory controller, a host device operably connected to the memory device, and/or other components of the memory system can track data as it is internally moved from one location in the memory device to another. As a result, memory devices configured in accordance with various embodiments of the present technology offer greater flexibility in consolidating, reconsolidating, and/or rearranging data stored to memory cells of the memory devices than conventional memory devices.

FIG. 1 is a block diagram schematically illustrating a memory system 190 configured in accordance with an embodiment of the present technology. The memory system 190 can include a memory device 100 that can be connected to any one of a number of electronic devices that is capable of utilizing memory for the temporary or persistent storage of information, or a component thereof. For example, the memory device 100 can be operably connected to a host device 108 and/or to a memory controller 101. The host device 108 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device 108 may be a networking device (e.g., a switch, a router, etc.) or a recorder of digital images, audio and/or video, a vehicle, an appliance, a toy, or any one of a number of other products. In one embodiment, the host device 108 may be connected directly to the memory device 100, although in other embodiments, the host device 108 may be indirectly connected to the memory device 100 (e.g., over a networked connection or through intermediary devices, such as through the memory controller 101).

The memory device 100 may employ a plurality of external terminals that include command and address terminals coupled to a command bus and an address bus to receive command signals CMD and address signals ADDR, respectively. The memory device may further include a chip select terminal to receive a chip select signal CS, clock terminals to receive clock signals CK and CKF, data clock terminals to receive data clock signals WCK and WCKF, data terminals DQ, RDQS, DBI, and DMI, and power supply terminals VDD, VSS, and VDDQ.

The power supply terminals of the memory device 100 may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in a row decoder 140, the internal potentials VOD and VARY can be used in sense amplifiers included in a memory array 150 of the memory device 100, and the internal potential VPERI can be used in many other circuit blocks.

The power supply terminals may also be supplied with power supply potential VDDQ. The power supply potential VDDQ can be supplied to an input/output (IO) circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the IO circuit 160 so that power supply noise generated by the IO circuit 160 does not propagate to the other circuit blocks.

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a CKE signal from a command decoder 115, an input buffer can receive the CK and CKF signals and the WCK and WCKF signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signals based on the received internal clock signals ICLK and a clock enable signal CKE from the command decoder 115. For example, the internal clock circuit 130 can include a clock path (not shown in FIG. 1) that receives the internal clock signal ICLK and provides various clock signals to the command decoder 115. The internal clock circuit 130 can further provide input/output (IO) clock signals. The IO clock signals can be supplied to the IO circuit 160 and can be used as a timing signal for determining an output timing of read data and the input timing of write data. The IO clock signals can be provided at multiple clock frequencies so that data can be output from and input into the memory device 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated that can be used by the command decoder 115, the column decoder 145, and/or other components of the memory device 100.

The memory device 100 may include an array of memory cells, such as memory array 150. The memory cells of the memory array 150 may be arranged in a plurality of memory regions, and each memory region may include a plurality of word lines (WL), a plurality of bit lines (BL), and a plurality of memory cells arranged at intersections of the word lines and the bit lines. In some embodiments, a memory region can be a one or more memory banks or another arrangement of memory cells. In these and other embodiments, the memory regions of the memory array 150 can be arranged in one or more groups (e.g., groups of memory banks, one or more logical memory ranks or dies, etc.). Memory cells in the memory array 150 can include any one of a number of different memory media types, including capacitive, magnetoresistive, ferroelectric, phase change, or the like. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches. The memory array 150 may also include plate lines and corresponding circuitry for managing their operation.

The command terminals and address terminals may be supplied with an address signal and a bank address signal from outside the memory device 100. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal (BADD) and supply the bank address signal to both the row decoder 140 and the column decoder 145.

The command and address terminals can be supplied with command signals CMD, address signals ADDR, and chip selection signals CS (e.g., from the memory controller 101 and/or the host device 108). The command signals may represent various memory commands (e.g., including access commands, which can include read commands and write commands). The select signal CS may be used to select the memory device 100 to respond to commands and addresses provided to the command and address terminals. When an active CS signal is provided to the memory device 100, the commands and addresses can be decoded and memory operations can be performed. The command signals CMD may be provided as internal command signals ICMD to a command decoder 115 via the command/address input circuit 105. The command decoder 115 may include circuits to decode the internal command signals ICMD to generate various internal signals and commands for performing memory operations, for example, a row command signal to select a word line and a column command signal to select a bit line. The internal command signals can also include output and input activation commands, such as a clocked command CMDCK (not shown) to the command decoder 115. The command decoder 115 may further include one or more registers 118 for tracking various counts or values (e.g., a row address and/or a column address corresponding to a previous memory location of data, a row address and/or a column address corresponding to a new memory location of data, etc.).

When a read command is issued, and a row address and a column address are timely supplied with the read command, read data can be read from memory cells in the memory array 150 designated by the row address and the column address. The read command may be received by the command decoder 115, which can provide internal commands to the IO circuit 160 so that read data can be output from the data terminals DQ, RDQS, DBI, and DMI via read/write (RW) amplifiers 155 and the IO circuit 160 according to the RDQS clock signals. The read data may be provided at a time defined by read latency information RL that can be programmed in the memory device 100, for example, in a mode register (not shown in FIG. 1). The read latency information RL can be defined in terms of clock cycles of the CK clock signal. For example, the read latency information RL can be a number of clock cycles of the CK signal after the read command is received by the memory device 100 when the associated read data is provided.

When a write command is issued, and a row address and a column address are timely supplied with the command, write data can be supplied to the data terminals DQ, DBI, and DMI over DQ lines connected to the memory device 100 according to the WCK and WCKF clock signals. The write command may be received by the command decoder 115, which can provide internal commands to the IO circuit 160 so that the write data can be received by data receivers in the IO circuit 160, and supplied via the IO circuit 160 and the RW amplifiers 155 to the memory array 150 over IO lines of the memory device 100. The write data may be written in the memory cell designated by the row address and the column address. The write data may be provided to the data terminals at a time that is defined by write latency WL information. The write latency WL information can be programmed in the memory device 100, for example, in the mode register (not shown in FIG. 1). The write latency WL information can be defined in terms of clock cycles of the CK clock signal. For example, the write latency information WL can be a number of clock cycles of the CK signal after the write command is received by the memory device 100 when the associated write data is received.

In some embodiments, when a write command is issued, the row address and a column address supplied with the write command can correspond to a programming sequence that defines a sequence of memory locations to which the memory device 100 is configured to write new data. In this manner, data stored on the memory device 100 can be consolidated on the memory device 100 at the time it is written to memory cells of the memory array 150. For example, the memory system 190 can write data to the memory array 150 in sequence, starting with memory cells in a preferred memory location (e.g., in a first memory bank in the memory array 150 and/or in each memory bank group). As a threshold number of the memory cells at the preferred memory location become utilized, the memory system 190 can proceed to write data to a next preferred memory location (e.g., the next memory bank in the memory array 150 and/or the next memory bank in each memory bank group) in the programming sequence. As data is written to memory cells of the memory array 150, the memory system 190 can track the last programmed or next-to-be programmed memory location (e.g., memory cell, memory row, memory column, memory bank, logical memory rank or die, etc.), such that data corresponding to a subsequent write command is written to the next-to-be programmed memory location and consolidates data stored on the memory array 150. In some embodiments, the memory system 190 can track the last programmed and/or the next-to-be programmed memory location using corresponding circuitry, such as one or more counters (e.g., a CBR counter), registers (e.g., the register 118), buffers, latches, embedded memories, etc., on the host device 108, on the memory controller 101, and/or on the memory device 100. In these and other embodiments, the corresponding circuitry can be reset in the event of power loss (e.g., powering down of the memory device 100) such that the memory system 190 is configured to write data to memory cells beginning at the first preferred memory location in the programming sequence when the memory system 190 is subsequently powered on. In some embodiments, the preferred programming sequence can be stored on the host device 108, on the memory controller 101, and/or on the memory device 100. In these and other embodiments, the preferred programming sequence can be loaded into the host device 108, into the memory controller 101, and/or into the memory device 100 (e.g., as the memory system 190 is powered on).

The memory array 150 may be refreshed or maintained to prevent data loss, either due to charge leakage or imprint effects. A refresh operation, may be initiated by the memory system 190 (e.g., by the host device 108, the memory controller 101, and/or the memory device 100), and may include accessing one or more rows (e.g., WL) and discharging cells of the accessed row to a corresponding SAMP. While the row is opened (e.g., while the accessed WL is energized), the SAMP may compare the voltage resulting from the discharged cell to a reference. The SAMP may then write back a logic value (e.g., charge the cell) to a nominal value for the given logic state. In some cases, this write back process may increase the charge of the cell to ameliorate the discharge issues discussed above. In other cases, the write back process may invert the data state of the cell (e.g., from high to low or low to high), to ameliorate hysteresis shift, material depolarization, or the like. Other refresh schemes or methods may also be employed.

In one approach, the memory device 100 may be configured to refresh the same row of memory cells in every memory bank of the memory array 150 simultaneously. In another approach, the memory device 100 may be configured to refresh the same row of memory cells in every memory bank of the memory array 150 sequentially. In still another approach, the memory device 100 can further include circuitry (e.g., one or more registers, latches, embedded memories, counters, etc.) configured to track row (e.g., word line) addresses, each corresponding to one of the memory banks in the memory array 150. In this approach, the memory device 100 is not constrained to refresh the same row in each memory bank of the memory array 150 before refreshing another row in one of the memory banks.

Regardless of the refresh approach, the memory device 100 can be configured to refresh memory cells in the memory array 150 within a given refresh rate or time window (e.g., 32 ms, 28 ms, 25 ms, 23 ms, 21 ms, 18 ms, 16 ms, 8 ms, etc.). In these embodiments, the memory system 190 can be configured to supply refresh commands to the memory device 100 in accordance with a specified minimum cadence tREFI. For example, the memory system 190 can be configured to supply one or more refresh commands to the memory device 100 at least every 7.8 μs such that an approximate minimum of 4000 refresh commands are supplied to the memory device 100 within a 32 ms time window.

As shown in FIG. 1, the memory device 100 can include a global cache 158. The global cache 158 may include a plurality of memory cells, latches, and/or memory registers configured to (e.g., temporarily) store data. In this regard, the global cache 158 may be configured as volatile memory (e.g., static random access memory (SRAM), dynamic random access memory (DRAM), synchronous dynamic random access memory (SDRAM), etc.) and/or may be configured as non-volatile memory (e.g., as NAND flash memory, NOR flash memory, phase change memory (PCM), ferroelectric random access memory (FeRAM), resistive random access memory (RRAM), magnetic random access memory (MRAM), etc.). Thus, memory cells in the global cache 158 can include any number of different memory media types, including capacitive, magnetoresistive, ferroelectric, phase change, or the like. Although the global cache 158 is illustrated external to the memory array 150 in FIG. 1, the global cache 158 in other embodiments can be internal to the memory array 150. In these embodiments, the global cache 158 can include one or more memory cells of the memory array 150 that are reserved (e.g., that are not addressable by various components of the memory system 190) for memory operations requiring the global cache 158.

As shown in FIG. 1, the global cache 158 can be operably connected to the memory array 150 (e.g., to the memory cells of the memory array 150). In some embodiments, the memory device 100 can be configured to read (e.g., copy or transfer) data stored on memory cells of the memory array 150 into the global cache 158. In these embodiments, the memory device 100 can be configured to read (e.g., copy or transfer) the data stored on the global cache 158 into the IO circuit 160 and/or onto the IO lines of the memory device 100. Data read into the IO circuit 160 and/or onto the IO lines of the memory device 100 from the global cache 158 can then be rewritten to any of the memory cells in the memory array 150. In this manner, the memory device 100 can consolidate, reconsolidate, rearrange, and/or manipulate data stored in the memory array 150, which can permit the memory device 100 to implement various other features. For example, in the case of consolidating and/or reconsolidating data stored to the memory array 150, the memory device 100 in some embodiments can consolidate unutilized memory cells (e.g., memory cells that are blank, erased, and/or programmed with stale data) in one or more memory regions (e.g., memory banks, logical memory ranks or dies, etc.) or portions of memory regions of the memory array 150 (e.g., by consolidating data stored to the memory array 150). In these embodiments, the memory system 190 can disable the one or more memory regions or portions of memory regions from receiving refresh commands such that the unutilized memory cells of the one or more memory regions or portions of memory regions are not refreshed during refresh operations, thereby conserving power that would otherwise be consumed by the memory device 100 to refresh the unutilized memory cells during the refresh operations.

In these and other embodiments, the memory device 100 can be configured to read (e.g., copy or transfer) the data stored on the global cache 158 and/or on the memory array 150 into various internal components of the memory device 100. For example, the memory device 100 can include one or more arithmetic logic units (ALU's) 165 operably connected to the memory array 150 and/or to the global cache 158. The ALU's 165 can provide computational power to the memory device 100 and/or to the memory array 150. In some embodiments, various computations of the ALU's 165 can require that data stored on the memory array 150 be arranged (e.g., physically ordered) in a particular manner. In these embodiments, the memory device 100 can read data stored on the memory array 150 into the global cache 158 (e.g., such that the data is arranged as required by the ALU's 165) and then can read the ordered data stored on the global cache 158 into the ALU's 165. In these and other embodiments, the memory device 100 can read data stored on the memory array 150 into the global cache 158 and can rewrite the data to the memory array 150 from the global cache 158 (e.g., such that the data is arranged on the memory array 150 as required by the ALU's 165). The memory device 100 can then read the ordered data stored on the memory array 150 directly into the ALU's 165. In this manner, memory devices configured in accordance with the present technology can expand the scopes of possible ALU and/or other hardware functions.

Figure 2:
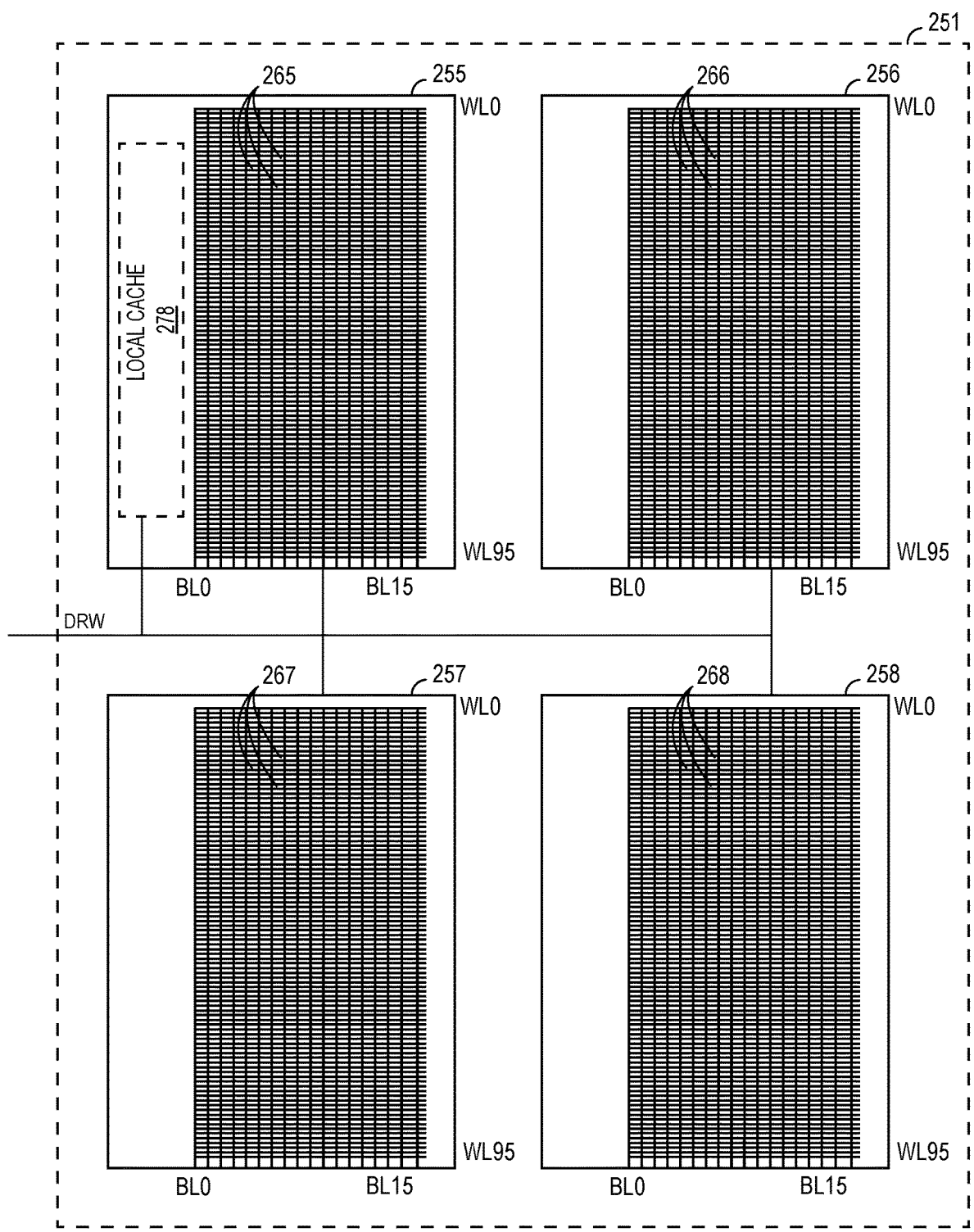
FIG. 2 is a block diagram schematically illustrating a memory region in a memory array of the memory device illustrated in FIG. 1.

FIG. 2 is a diagram schematically illustrating a memory region (in this case a memory bank group 251) in the memory array 150. As shown, the memory bank group 251 includes four memory banks 255-258 having a respective plurality of word lines WL0-WL95 and a respective plurality of bit lines BL0-BL15. Each of the memory banks 255-258 further includes memory cells 265-268, respectively, at intersections of the respective word lines WL0-WL95 and bit lines BL0-BL17.

The memory device 100 can be configured to consolidate, reconsolidate, rearrange, and/or manipulate data stored to memory cells of the memory array 150. In some embodiments, the memory device 100 can be configured to copy data stored to memory cells in a first row (e.g., a first word line) to memory cells in a second row (e.g., a second word line). For example, within the memory bank 255, the memory device 100 can be configured to copy data stored to memory cells 265 of a word line WL8 to memory cells 265 of a word line WL5. The WL8 can share a column (e.g., a bit line BL3) with the word line WL5 such that the memory device 100 can open (e.g., activate) the word line WL8 and can open (e.g., activate) the word line WL5 while the word line WL8 is open. This can cause the data stored on memory cells of the word line WL8 to overwrite the data stored on memory cells of the word line WL5. In some embodiments, the memory device 100 can then erase data stored in the first row (e.g., data stored on memory cells of the word line WL8). In this manner, the memory device 100 can be configured to copy data stored to an entire row of memory cells to another row of memory cells in a single operation, thereby consolidating, reconsolidating, rearranging, and/or manipulating data stored on a memory region of the memory array 150.

The memory bank 255 of the memory bank group 251 illustrated in FIG. 2 can further include a local cache 278 (e.g., in addition to or in lieu of the global cache 158). The local cache 278 can be operably connected to the memory cells 265, 266, 267, and/or 268 of the memory banks 255, 256, 257, and/or 258, respectively. Additionally or alternatively, the local cache 278 can be operably connected to one or more other memory regions of the memory array 150. Although illustrated as part of the memory bank 255 in FIG. 2, the local cache 278 can be located at other locations on the memory device 100 in other embodiments, such as at other locations internal or external to the memory array 150, at other locations on and/or spread across one or more other memory regions of the memory array 150 in addition to or in lieu of the memory bank 255, etc. In some embodiments, the memory device 100 can include multiple local caches 278. For example, the memory device 100 can include a local cache 278 per memory region (e.g., per group of word lines and/or bit lines, per memory bank, per group of memory banks, per logical memory rank or die, etc.).

The local cache 278 may include a plurality of memory cells, latches, and/or memory registers configured to (e.g., temporarily) store data. In this regard, the local cache 278 may be configured as volatile memory (e.g., as static random access memory (SRAM), dynamic random access memory (DRAM), synchronous dynamic random access memory (SDRAM), etc.) and/or may be configured as non-volatile memory (e.g., as NAND flash memory, NOR flash memory, phase change memory (PCM), ferroelectric random access memory (FeRAM), resistive random access memory (RRAM), magnetic random access memory (MRAM), etc.). Thus, memory cells in the local cache 278 can include any number of different memory media types, including capacitive, magnetoresistive, ferroelectric, phase change, or the like. In some embodiments, the local cache 278 can include one or more memory cells 265 of the memory bank 255 and/or of the memory array 150 that are reserved (e.g., that are not addressable by various other components of the memory system 190) for memory operations requiring a local cache 278.

In some embodiments, the memory device 100 can be configured to read (e.g., copy or transfer) data stored on memory cells 265, 266, 267, and/or 268 of the memory bank 255, 256, 257, and/or 258 into the local cache 278. In these embodiments, the memory device 100 can be configured to read (e.g., copy or transfer) the data stored on the local cache 278 into various components of the memory device 100 (e.g., into the ALU's 165), into the IO circuit 160, and/or onto the IO lines of the memory device 100. Data read into the IO circuit 160 and/or onto the IO lines of the memory device 100 from the local cache 278 can be rewritten to any of the memory cells in the memory array 150 and/or in the memory banks 255, 256, 257, and/or 258. Thus, the memory device 100 can consolidate, reconsolidate, rearrange, and/or manipulate data stored in the memory array 150 and/or in any of the memory banks 255-258 in a manner consistent with the discussion above with respect to the global cache 158 illustrated in FIG. 1.

Additionally or alternatively, the memory device 100 can be configured to read (e.g., copy or transfer) data stored on the local cache 278 and directly write the data to memory cells of the memory array 150 using DRW lines of the memory device 100. For example, the memory device 100 can use one or more DRW lines to directly write data read from the local cache 278 to memory cells 265 of the memory bank 255 and/or to memory cells 266, 267, and/or 268 of the memory bank(s) 256, 257, and/or 258, respectively. In this manner, the memory device 100 can consolidate, reconsolidate, rearrange, and/or manipulate data stored in one memory region or group of memory regions of the memory array 150 without occupying the IO circuit 160, the IO lines operably connected to other memory regions of the memory device 100, and/or the DQ lines external to the memory device 100. Thus, as the memory device 100 consolidates, reconsolidates, rearranges, and/or manipulates data stored in one memory region or group of memory regions of the memory array 150, the memory device 100 can remain free to perform operations (e.g., read, write, and/or erase operations) on memory cells of the other memory regions of the memory array 150.

In these and other embodiments, the memory device 100 can be configured to read (e.g., copy or transfer) data stored on memory cells of the memory array 150 and/or to directly write the data to memory cells of the memory array 150 using the DRW lines of the memory device 100 and without using a local cache 278. For example, the memory device 100 can use one or more DRW lines to read data from memory cells of a memory bank (e.g., the memory cells 265 of the memory bank 255) and to directly write the data to memory cells of the same or a different memory bank (e.g., to the memory cells 265, 266, 267, and/or 268 of the memory banks 255, 256, 257, and/or 258, respectively). In some embodiments, the memory device 100 can include additional multiplexers, routing, level shifters, amplifiers, buffers, inverters, first-in-first-out (FIFO) buffers, etc. to facilitate the data transfer on the DRW lines. In these and other embodiments, the memory device 100 can be configured to perform data transfers over the DRW lines using normal activate, read, write, erase, etc. commands. In this manner, the memory device 100 can consolidate, reconsolidate, rearrange, and/or manipulate data stored in one memory region or group of memory regions of the memory array 150 without occupying the 10 circuit 160, the IO lines operably connected to other memory regions of the memory device 100, and/or the DQ lines external to the memory device 100. Thus, as the memory device 100 consolidates, reconsolidates, rearranges, and/or manipulates data stored in one memory region or group of memory regions of the memory array 150 using the corresponding DRW lines, the memory device 100 can remain free to perform operations (e.g., read, write, and/or erase operations) on memory cells of the other memory regions of the memory array 150.

In some embodiments, the memory device 100 can be configured to track, store, and/or report a data transfer (e.g., data consolidation, data reconsolidation, data rearrangement, and/or data manipulation) before, during, and/or after the data transfer operation is completed. For example, the memory device 100 can be configured to track a data transfer from an old row and column address to a new row and column address. In these and other embodiments, the memory device 100 can store information regarding the data transfer (e.g., the new and/or old row and column addresses) on the memory device 100 (e.g., in a data transfer table). In these and still other embodiments, the memory device 100 can be configured to report information regarding the data transfer to various components of the memory system 190 operably connected to the memory regions, such as to the memory controller 101 and/or to the host device 108.

Figure 3:
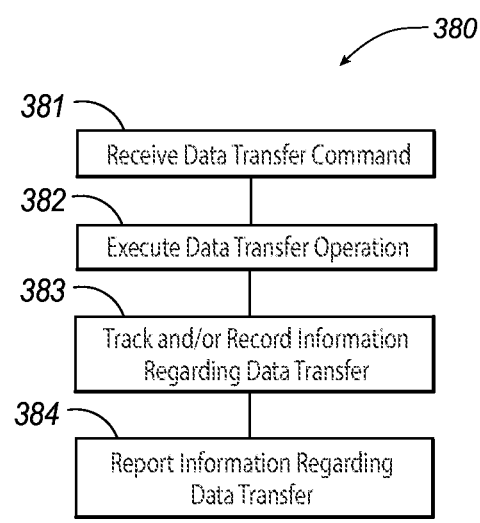
FIG. 3 is a flow diagram illustrating an on-die data transfer routine of a memory device and/or a memory system configured in accordance with various embodiments of the present technology.

FIG. 3 is flow diagram illustrating a data transfer routine 380 of a memory device configured in accordance with various embodiments of the present technology. In some embodiments, the routine 380 can be executed, at least in part, by various components of the memory device. For example, the routine 380 can be carried out by a row decoder, a column decoder, a global cache, a local cache, an ALU, an IO Circuit, an RW Amp, a memory array, a memory bank, and/or a logical memory rank or die. In these and other embodiments, all or a subset of the steps of the routine 380 can be performed by other components of the memory device (e.g., a command decoder, a word line, a bit line, etc.), by a memory controller operably connected to the memory device, by a host device operably connected to the memory device and/or to the memory controller, and/or by other components of a memory system containing the memory device.

The routine 380 can begin at block 381 by receiving a data transfer command. In some embodiments, the data transfer command can be issued by a host device and/or a memory controller operably connected to the memory device. In these and other embodiments, the data transfer command can be issued by the memory device (e.g., by one or more internal components of the memory device) and/or other components of the memory system. The data transfer command can instruct the memory device to consolidate, reconsolidate, rearrange, or otherwise manipulate data stored on memory cells of the memory array.

At block 382, the routine 380 can execute a data transfer operation corresponding to the data transfer command received at block 381. In some embodiments, to execute the data transfer operation, the routine 380 can move (e.g., copy or transfer) data stored on memory cells at one memory location within the memory device to other memory cells at another memory location within the memory device. For example, the routine 380 can read (e.g., copy or transfer) data from memory cells at one memory location of the memory device and write the data to memory cells at another memory location of the memory device. In these and other embodiments, to execute the data transfer routine, the routine 380 can permanently or temporarily rearrange data stored on memory cells of the memory device. For example, the routine 380 can read (e.g., copy or transfer) data from memory cells at one memory location of the memory device into various components of the memory device (e.g., one or more global caches, one or more local caches, one or more ALU's, etc.).

In some embodiments, to execute the data transfer operation, the routine 380 can instruct the memory device to copy data stored on a first row (e.g., a first word line) of memory cells to a second row (e.g., a second word line) of memory cells. For example, the first and second rows can share a column (e.g., a bit line). In this example, the routine 380 can open (e.g., activate) the first row of memory cells and can open the second row of memory cells while the first row of memory cells is open such that data stored to the first row of memory cells can overwrite data stored on the second row of memory cells, thereby copying the data stored on the first row of memory cells to the second row of memory cells. In some embodiments, the routine 380 may then erase the data stored on the first row of memory cells.

In these and other embodiments, to execute the data transfer operation, the routine 380 can instruct the memory device to read data stored on memory cells of the memory device into one or more global or local caches operably connected to all or a subset of the memory cells of the memory device. For example, the routine 380 can read (e.g., copy or transfer) data stored on memory cells of the memory device into a global cache. In these embodiments, the routine 380 can read (e.g., copy or transfer) the data stored on the global cache into the IO circuit, onto the IO lines of the memory device, and/or onto DRW lines of the memory device, and the routine 380 can rewrite the read data to any of the memory cells in the memory device. As another example, the routine 380 can read (e.g., copy or transfer) the data stored on the global cache into various components of the memory device (e.g., one or more ALU's).

In these and other embodiments, the routine 380 can read (e.g., copy or transfer) data stored on memory cells of the memory device into one or more local caches. In these embodiments, the routine can read (e.g., copy or transfer) the data stored on the local cache(s) into various components of the memory device (e.g., into the one or more ALU's), into the IO circuit, onto the IO lines of the memory device, and/or onto the DRW lines of the memory device. Data read into the IO circuit, onto the IO lines of the memory device, and/or onto the DRW lines of the memory device from the local cache(s) can be rewritten to any of the memory cells in a local memory region, in a local group of memory regions, and/or in the memory device.

In these and still other embodiments, to execute the data transfer operation, the routine 380 can instruct the memory device to directly write data stored on memory cells at one memory location of the memory device to memory cells at another memory location of the memory device (e.g., without using a local or global cache). For example, the routine 380 can read (e.g., copy or transfer) data stored on memory cells of the memory device onto local DRW lines of the memory device operably coupled to the memory cells, and the routine 380 can rewrite the read data to any of the (e.g., local) memory cells operably connected to the DRW lines.

In this manner, the routine 380 can consolidate, reconsolidate, rearrange, and/or otherwise manipulate (e.g., order) data stored on memory cells of the memory device, which can permit the memory device to implement various other features. For example, the memory device can disable one or more memory regions or portions of memory regions that include unutilized memory cells from receiving refresh commands (e.g., after the routine 380 performs one or more consolidation, reconsolidation, and/or rearrangement data transfer operations) such that the unutilized memory cells are not refreshed during refresh operations of the memory device. As another example, the memory device can perform various computations (e.g., using the one or more ALU's and/or after the routine 380 performs one or more rearrangement and/or manipulation (e.g., ordering) data transfer operations). As a further example, the memory device (e.g., the routine 380) can perform two or more data transfer operations simultaneously (e.g., when the routine 380 does not utilize the DQ lines, the TO circuit, the TO lines, and/or the DRW lines to perform one or more of the data transfer operations).

At block 383, the routine 380 can track and/or record various information regarding a data transfer operation executed at block 382. In some embodiments, the routine 380 can track a data transfer from an old row and column address to a new row and column address. In these and other embodiments, the routine 380 can track data as it is read into various components of the memory device, is written to one or more memory cells of the memory device, is erased, and/or is otherwise manipulated. In these and still other embodiments, the routine 380 can store information regarding the data transfer (e.g., the new and/or old row and column addresses, how the data was manipulated, whether the data was erased, etc.) on the memory device. In these embodiments, the routine 380 can stored the information in a data transfer table that is stored on the memory device and/or on other components of the memory system (e.g., on the memory controller, on the host device, etc.).

At block 384, the routine 380 can report various information regarding a data transfer operation executed at block 382. In some embodiments, the various information can include all or a portion of the various information tracked and/or recorded at block 383. In these and other embodiments, the various information can be values or other data computed, generated, and/or retrieved by the memory device (e.g., using the one or more ALU's). In these and still other embodiments, the routine 380 can report the various information to one or more components of the memory device, to the memory controller, to the host device, and/or to other components of the memory system. For example, the routine 380 can report the various information to various components of the memory system (e.g., to the memory controller and/or to the host device) such that these components can track where data is located in the memory device and/or track what memory cells and/or memory regions of the memory device are utilized (e.g., programmed with and/or storing valid, non-stale data) and/or are unutilized (e.g., blank, erased, and/or programmed with stale data). In other embodiments, the routine 380 can report the various information to only components of the memory device. In these embodiments, when the memory device receives a command from outside of the memory device, along with an outdated row address and/or column address, the memory device can internally translate the outdated row address and/or column address to a new, updated row address and/or column address (e.g., using an internally stored data transfer table) corresponding to a memory location where the data has been transferred. At this point, the memory device can proceed to execute the received command on the data at the new, updated row and/or column address(es).

Although the steps of the routine 380 are discussed and illustrated in a particular order, the method illustrated by the routine 380 in FIG. 3 is not so limited. In other embodiments, the method can be performed in a different order. In these and other embodiments, any of the steps of the routine 380 can be performed before, during, and/or after any of the other steps of the routine 380. For example, the step of block 383 can be performed before, during, and/or after the steps of blocks 382 and/or 384; and/or the step of block 384 can be performed before, during, and/or after the step of block 382. Moreover, a person of ordinary skill in the relevant art will readily recognize that the illustrated method can be altered and still remain within these and other embodiments of the present technology. For example, one or more steps of the routine 380 illustrated in FIG. 3 can be omitted and/or repeated in some embodiments.

Figure 4:
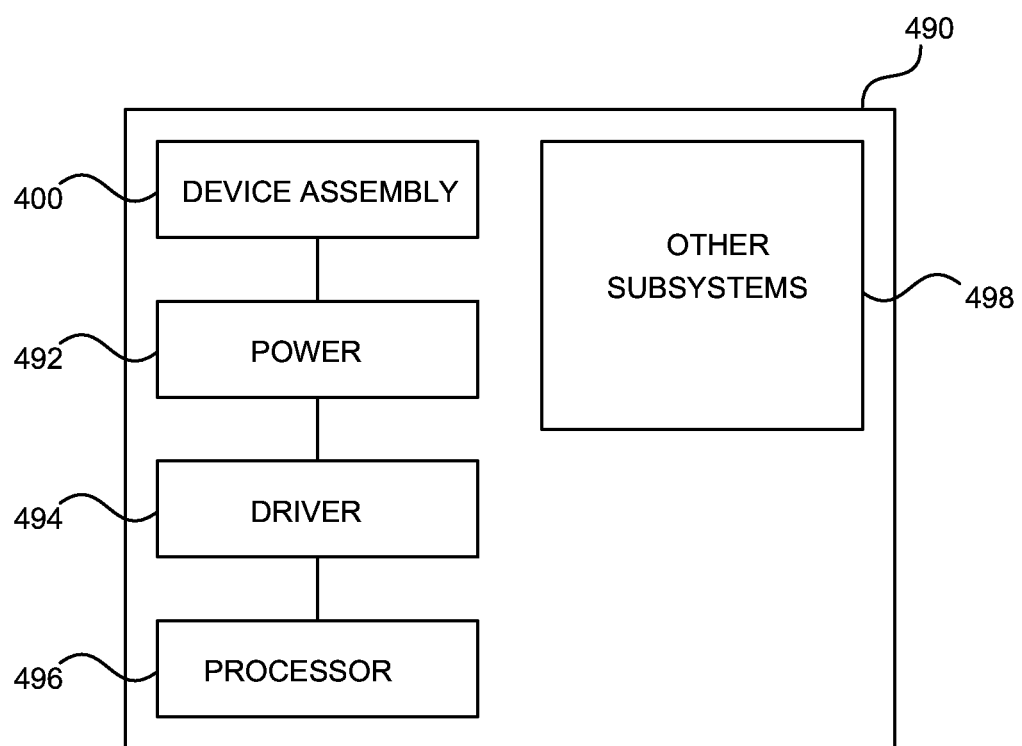
FIG. 4 is a schematic view of a system that includes a memory device configured in accordance with various embodiments of the present technology.

FIG. 4 is a schematic view of a system that includes a memory device in accordance with embodiments of the present technology. Any one of the foregoing memory devices described above with reference to FIGS. 1-3 can be incorporated into any of a myriad of larger and/or more complex systems, a representative example of which is system 490 shown schematically in FIG. 4. The system 490 can include a semiconductor device assembly 400, a power source 492, a driver 494, a processor 496, and/or other subsystems and components 498. The semiconductor device assembly 400 can include features generally similar to those of the memory device described above with reference to FIGS. 1-3, and can, therefore, include various features of memory content authentication. The resulting system 490 can perform any of a wide variety of functions, such as memory storage, data processing, and/or other suitable functions. Accordingly, representative systems 490 can include, without limitation, hand-held devices (e.g., mobile phones, tablets, digital readers, and digital audio players), computers, vehicles, appliances, and other products. Components of the system 490 may be housed in a single unit or distributed over multiple, interconnected units (e.g., through a communications network). The components of the system 490 can also include remote devices and any of a wide variety of computer readable media.

CONCLUSION

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology, as those skilled in the relevant art will recognize. For example, while steps are presented and/or discussed in a given order, alternative embodiments can perform steps in a different order. Furthermore, the various embodiments described herein can also be combined to provide further embodiments.

From the foregoing, it will be appreciated that specific embodiments of the technology have been described herein for purposes of illustration, but well-known structures and functions have not been shown or described in detail to avoid unnecessarily obscuring the description of the embodiments of the technology. Where the context permits, singular or plural terms can also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Where the context permits, singular or plural terms can also include the plural or singular term, respectively. Additionally, the terms "comprising," "including," "having" and "with" are used throughout to mean including at least the recited feature(s) such that any greater number of the same feature and/or additional types of other features are not precluded.

From the foregoing, it will also be appreciated that various modifications can be made without deviating from the technology. For example, various components of the technology can be further divided into subcomponents, or that various components and functions of the technology can be combined and/or integrated. Furthermore, although advantages associated with certain embodiments of the technology have been described in the context of those embodiments, other embodiments can also exhibit such advantages, and not all embodiments need necessarily exhibit such advantages to fall within the scope of the technology. Accordingly, the disclosure and associated technology can encompass other embodiments not expressly shown or described herein.

We claim:

1. An apparatus, comprising:
a memory array including memory cells arranged in a plurality of memory regions, wherein the plurality of memory regions include a first group of memory regions and a second group of memory regions different from the first group; and
a plurality of internal input/output (I/O) lines operably connected to the memory array, wherein the apparatus is configured to internally transfer data stored in one or more memory cells at a first memory location in the first group of memory regions to one or more memory cells at a second memory location in the first group of memory regions using a first subset of I/O lines of the plurality of I/O lines and without using (i) a second subset of I/O lines of the plurality of I/O lines or (ii) data lines external to the apparatus,
wherein the first subset includes an I/O line that is operably connected directly to the first group of memory regions and that is not operably connected directly to the second group of memory regions.

2. The apparatus of claim 1, wherein:
the plurality of internal I/O lines include (i) first data read/write (DRW) lines that are operably connected directly to the first group of memory regions and that are not operably connected directly to the second group of memory regions, (ii) second DRW lines that are operably connected directly to the second group of memory regions and that are not operably connected directly to the first group of memory regions, and (iii) I/O data lines that are operably connected to both the first group of memory regions and the second group of memory regions via the first DRW lines and the second DRW lines, respectively; and
the first subset of I/O lines includes the first DRW lines and/or the I/O data lines.

3. The apparatus of claim 2, wherein the second subset of I/O lines includes the second DRW lines and/or the I/O data lines.

4. The apparatus of claim 1, wherein the apparatus is configured to internally transfer the data in response to a consolidation command, a reconsolidation command, a rearrangement command, and/or a data manipulation command.

5. The apparatus of claim 1, wherein the apparatus is configured to internally transfer the data in response to an activate command, a read command, a write command, and/or an erase command.

6. The apparatus of claim 1, wherein the apparatus is further configured to perform an access operation on the second group of memory regions while internally transferring the data from the one or more memory cells at the first memory location to the one or more memory cells at the second memory location.

7. The apparatus of claim 6, wherein:
the data is first data; and
the access operation includes internally transferring second data stored in one or more memory cells at a first memory location in the second group of memory regions to one or more memory cells at a second memory location in the second group of memory regions using the second subset of I/O lines and without using (i) the first subset of I/O lines or (ii) the data lines external to the apparatus.

8. The apparatus of claim 6, wherein:
the data is first data; and
the access operation includes transferring second data to or from the second group of memory regions using the data lines external to the apparatus.

9. The apparatus of claim 1, wherein:
the apparatus further comprises (i) an arithmetic logic unit (ALU), (ii) a global cache that is operably connected to all of the memory cells of the memory array, and/or (iii) a local cache that is operably connected to a subset of the memory cells of the memory array;
the subset includes the one or more memory cells at the first memory location and the one or more memory cells at the second memory location; and
the apparatus is configured to internally transfer the data using the ALU, the global cache, and/or the local cache.

10. The apparatus of claim 1, wherein the apparatus is a memory die.

11. A method, comprising:
internally transferring data stored in one or more memory cells at a first memory location in a first group of memory regions of a memory array of a memory device to one or more memory cells at a second memory location in the first group of memory regions using a first subset of input/output (I/O) lines of the memory device and without using (i) a second subset of I/O lines of the memory device or (ii) data lines external to the memory device,
wherein the first subset includes an I/O line that is operably connected directly to the first group of memory regions and that is not operably connected directly to a second group of memory regions.

12. The method of claim 11, wherein:
the second subset of I/O lines includes first data read/write (DRW) lines that are operably connected directly to the second group of memory regions and that are not operably connected directly to the first group of memory regions; and
the first subset of I/O lines includes (i) second DRW lines that are operably connected directly to the first group of memory regions and that are not operably connected directly to the second group of memory regions and/or (ii) I/O data lines that are operably connected to the first group of memory regions and to the second group of memory regions via the second DRW lines and the first DRW lines, respectively.

13. The method of claim 12, wherein the second subset of I/O lines further includes the I/O data lines.

14. The method of claim 11, wherein internally transferring the data includes internally transferring the data in response to a consolidation command, a reconsolidation command, a rearrangement command, a data manipulation command, an activate command, a read command, a write command, and/or an erase command.

15. The method of claim 11, further comprising performing an access operation on the second group of memory regions while internally transferring the data from the one or more memory cells at the first memory location to the one or more memory cells at the second memory location.

16. The method of claim 15, wherein:
the data is first data; and
performing the access operation includes—
    internally transferring second data stored in one or more memory cells at a first memory location in the second group of memory regions to one or more memory cells at a second memory location in the second group of memory regions using the second subset of I/O lines and without using (i) the first subset of I/O lines or (ii) the data lines external to the memory device, or
    transferring third data to or from the second group of memory regions using the data lines external to the apparatus.

17. A system, comprising:
a memory controller; and
a memory device operably connected to the memory controller via data lines external to the memory device, wherein the memory device includes—
    a memory array having memory cells arranged in a plurality of memory regions including a first group of memory regions and a second group of memory regions separate from the first group of memory regions, and
    a plurality of internal input/output (I/O) lines operably connected to the memory array,
    wherein the memory device is configured to internally transfer data stored in one or more memory cells at a first location in the first group of memory regions to one or more memory cells at a second location in the first group of memory regions using a first subset of I/O lines of the plurality of I/O lines and without using (i) a second subset of I/O lines of the plurality of I/O lines or (ii) the data lines, and
    wherein the first subset includes an I/O line that is operably connected directly to the first group of memory regions and that is not operably connected directly to the second group of memory regions.

18. The system of claim 17, wherein the memory device is further configured to perform an access operation on the second group of memory regions while internally transferring the data from the one or more memory cells at the first memory location to the one or more memory cells at the second memory location.

19. The system of claim 18, wherein:
the data is first data; and
to perform the access operation, the memory device is configured to—
    internally transfer second data stored in one or more memory cells at a first memory location in the second group of memory regions to one or more memory cells at a second memory location in the second group of memory regions using the second subset of I/O lines and without using (i) the first subset of I/O lines or (ii) the data lines, or
    transfer third data to or from the second group of memory regions using the data lines.

20. The system of claim 18, the memory device is configured to internally transfer the data and/or perform the access operation in response to a consolidation command, a reconsolidation command, a rearrangement command, a data manipulation command, an activate command, a read command, a write command, and/or an erase command received from the memory controller.

* * * * *